United States Patent
Sugiyama et al.

(10) Patent No.: US 11,010,576 B2
(45) Date of Patent: May 18, 2021

(54) SUBSTRATE WORK SYSTEM

(71) Applicant: FUJI CORPORATION, Chiryu (JP)

(72) Inventors: Kenji Sugiyama, Anjo (JP); Kazuya Kotani, Toyota (JP); Hirotake Esaki, Ichinomiya (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/631,079

(22) PCT Filed: Jul. 20, 2017

(86) PCT No.: PCT/JP2017/026305
§ 371 (c)(1),
(2) Date: Jan. 14, 2020

(87) PCT Pub. No.: WO2019/016923
PCT Pub. Date: Jan. 24, 2019

(65) Prior Publication Data
US 2020/0151414 A1 May 14, 2020

(51) Int. Cl.
*G06K 19/00* (2006.01)
*G06K 7/14* (2006.01)
(Continued)

(52) U.S. Cl.
CPC ....... *G06K 7/1417* (2013.01); *G06K 7/10722* (2013.01); *G06K 7/1413* (2013.01); *G06Q 50/04* (2013.01)

(58) Field of Classification Search
CPC combination set(s) only.
See application file for complete search history.

(56) References Cited

U.S. PATENT DOCUMENTS

| | | |
|---|---|---|
| 5,930,140 A | 7/1999 | Asai et al. |
| 2010/0223781 A1 | 9/2010 | Sumi |

(Continued)

FOREIGN PATENT DOCUMENTS

| | | |
|---|---|---|
| CN | 101356869 A | 1/2009 |
| JP | 7-85202 A | 3/1995 |

(Continued)

OTHER PUBLICATIONS

T. C. Cucu, G. Varzaru, C. Turcu, N. D. Codreanu, I. Plotog and R. Fuica, "1D and 2D solutions for traceability in an Electronic Manufacturing Services company," 2008 31st International Spring Seminar on Electronics Technology, Budapest, 2008, pp. 585-588, doi: 10.1109/ISSE.2008.5276596. (Year: 2008).*

(Continued)

*Primary Examiner* — Matthew Mikels
(74) *Attorney, Agent, or Firm* — Oblon, McClelland, Maier & Neustadt, L.L.P.

(57) ABSTRACT

A substrate work system including an information management device to manage traceability information of configuration items that configure a circuit board product; an imaging device to image an identification code attached to the configuration item; and an imaging control device to read the identification code imaged by the imaging device, and transmit a serial number recorded in the identification code to the information management device. The imaging control device includes a compatibility conditions setting section to set compatibility conditions that the identification code attached to the configuration item should satisfy, or compatibility conditions that the serial number recorded in the identification code should satisfy, a compatibility conditions determining section configured to determine whether the imaged identification code or the serial number recorded on the imaged identification code satisfies the compatibility (Continued)

conditions, and a transmitting section transmit the serial number to the information management device.

5 Claims, 3 Drawing Sheets

(51) Int. Cl.
  *G06K 7/10* (2006.01)
  *G06Q 50/04* (2012.01)

(56) References Cited

U.S. PATENT DOCUMENTS

2011/0302776 A1   12/2011   Kato et al.
2017/0079169 A1    3/2017   Morita

FOREIGN PATENT DOCUMENTS

| JP | 2007-94982 A | 4/2007 |
| JP | 2011-23554 A | 2/2011 |
| WO | WO 2015/132905 A1 | 9/2015 |

OTHER PUBLICATIONS

International Search Report dated Oct. 3, 2017 in PCT/JP2017/026305 filed Jul. 20, 2017, 1 page.
Extended European Search Report dated Jun. 9, 2020 in corresponding European Patent Application No. 17918187.0, 7 pages.

* cited by examiner

SUBSTRATE WORK SYSTEM

TECHNICAL FIELD

The present disclosure relates to a substrate work system.

BACKGROUND ART

Technology for managing traceability information of configuration items such as circuit boards and components used for manufacturing circuit board products are known. For example, patent literature 1 discloses technology in which a board ID code label on which a board ID is recorded is attached to a circuit board, and the board ID is read from the board ID code label attached to the circuit board loaded into a component mounting line when the circuit board product is manufactured. According to the technology disclosed in patent literature 1, traceability information associated with the read board IDs is managed by being registered in a database.

CITATION LIST

Patent Literature

Patent literature 1: International publication WO2015/132905

SUMMARY

Technical Problem

If dust, oil, or the like adheres to the board ID code label attached to the circuit board, the board ID code label may be erroneously read, and the traceability information associated with the wrong board ID may be registered in the database.

It is an object of the present specification to provide a substrate work system capable of reliably registering traceability information.

Solution to Problem

Disclosed herein is a substrate work system including: an information management device configured to manage traceability information of configuration items that configure a circuit board product; an imaging device configured to image an identification code attached to the configuration item; and an imaging control device configured to read the identification code imaged by the imaging device, and transmit a serial number recorded in the identification code to the information management device. The imaging control device includes: a compatibility conditions setting section configured to set compatibility conditions that the identification code attached to the configuration item should satisfy, or compatibility conditions that the serial number recorded in the identification code should satisfy; a compatibility conditions determining section configured to determine whether the imaged identification code or the serial number recorded on the imaged identification code satisfies the compatibility conditions set by the compatibility conditions setting section; and a transmitting section configured to, in a case in which it is determined that the identification code or the serial number recorded on the identification code satisfies the compatibility conditions set by the compatibility conditions setting section, transmit the serial number to the information management device.

Advantageous Effects

According to the disclosed substrate work system, when it is determined that the imaged identification code or the serial number recorded on the imaged identification code satisfies the compatibility conditions set by the compatibility conditions setting section, the serial number is transmitted to the information management device. Thus, the substrate work system can register reliable traceability information in the information management device.

DESCRIPTION OF EMBODIMENTS

1. Configuration of Substrate Work System 1

Embodiments to which the substrate work system of this disclosure is applied are described below referring to the figures. First, referring to FIG. 1, a schematic configuration of substrate work system 1 will be described.

Figure 1:
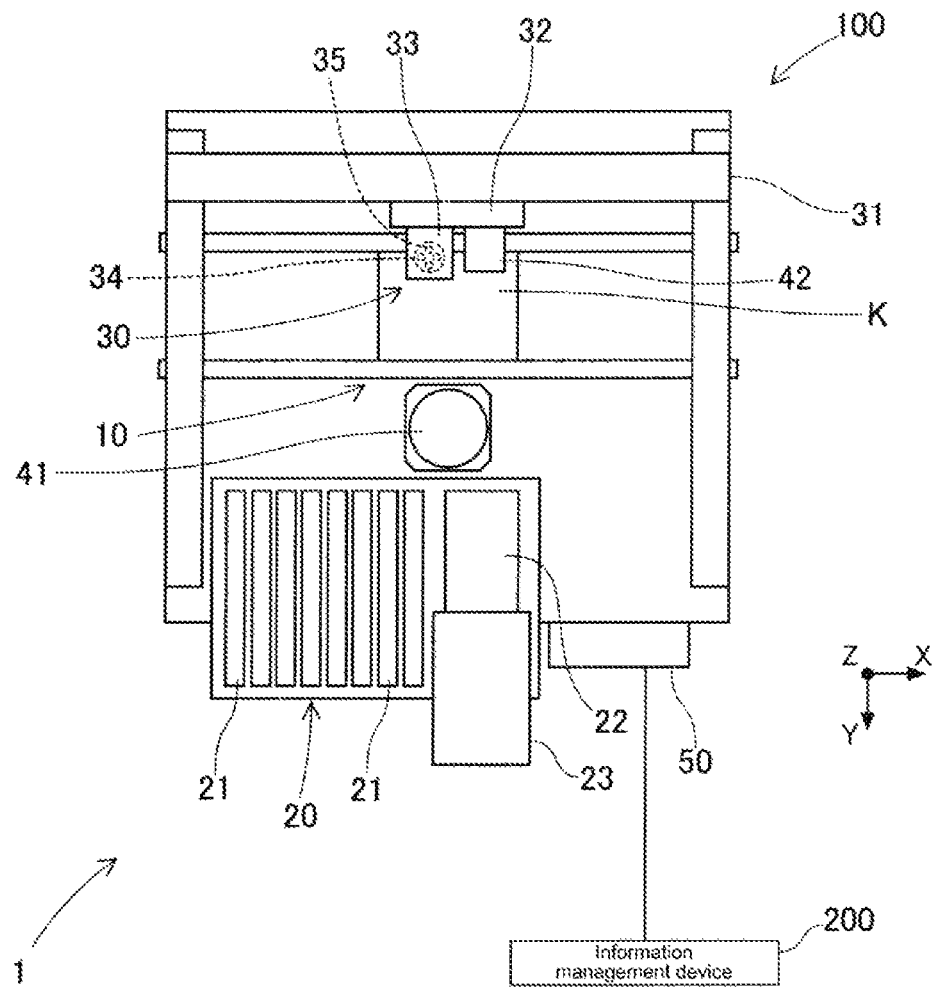
FIG. 1 is a plan view of a substrate work system in one embodiment of the disclosure.

As shown in FIG. 1, substrate work system 1 includes multiple substrate work machines 100 and information management device 200, with the multiple substrate work machines 100 being communicably connected to information management device 200.

Substrate work machine 100 is provided mainly with board conveyance device 10, component supply device 20, component transfer device 30, component camera 41, board camera 42, and control device 50. In the descriptions below, the horizontal width direction of substrate work machine 100 (left-right direction in FIG. 1) is the X-axis direction, the horizontal lengthwise direction of substrate work machine 100 (up-down direction in FIG. 1) is the Y-axis direction, and the direction perpendicular to the X axis and Y axis (perpendicular to the page in FIG. 1) is the Z-axis direction.

Board conveyance device 10 is composed of a belt conveyor or the like, and conveys circuit boards K sequentially in the X-axis direction. Board conveyance device 10 positions circuit board K at a specified position inside substrate work machine 100. When the process of mounting components on the positioned circuit board K is complete, board conveyance device 10 unloads circuit board K outside of substrate work machine 100.

Component supply device 20 supplies components to be mounted on circuit board K. Component supply device 20 includes multiple slots arranged in the X-axis direction, and a feeder 21 is detachably set to each of the multiple slots. Component supply device 20 supplies components to a removal section positioned at the leading end of feeder 21 (the upper side in FIG. 1) by feeder 21 indexing carrier tape.

Also, component supply device 20 supplies relatively large electronic components such as leaded components in a state lined up on tray 22. Component supply device 20 stores multiple trays 22 in storage rack 23 divided in the vertical direction, and pulls forward a specified tray 22 according to mounting processing so as to supply components to the removal section.

Component transfer device 30 picks up and holds a component supplied to the removal section and mounts the component on the positioned circuit board K. Component transfer device 30 is provided with head driving device 31, moving body 32, and mounting head 33. Head driving device 31 is configured to move moving table 32 in the X-axis direction and the Y-axis direction by a linear motion mechanism. Mounting head 33 is a holding device for holding a component, and is configured to be detachable from moving body 32. Multiple suction nozzles 35 capable of holding components are detachably provided on nozzle holders 34 provided on mounting head 33.

Suction nozzle 35 is supported by mounting head 33 to be rotatable about an axis parallel to the Z-axis direction and movable up and down. Suction nozzle 35 picks up and holds the component supplied to the removal section by suction, and mounts the held component on the positioned circuit board K.

Component camera 41 and board camera 42 are digital-type imaging devices having an imaging element such as a CCD or a CMOS, Component camera 41 is fixed to the base of substrate work machine 100 with the optical axis oriented in the Z-axis direction, and captures an image of a component held by suction nozzle 35 of mounting head 33, which is a holding device, from below. Board camera 42 is fixed to moving body 32 with its optical axis oriented in the Z-axis direction, and captures an image of circuit board K from above.

Figure 2:
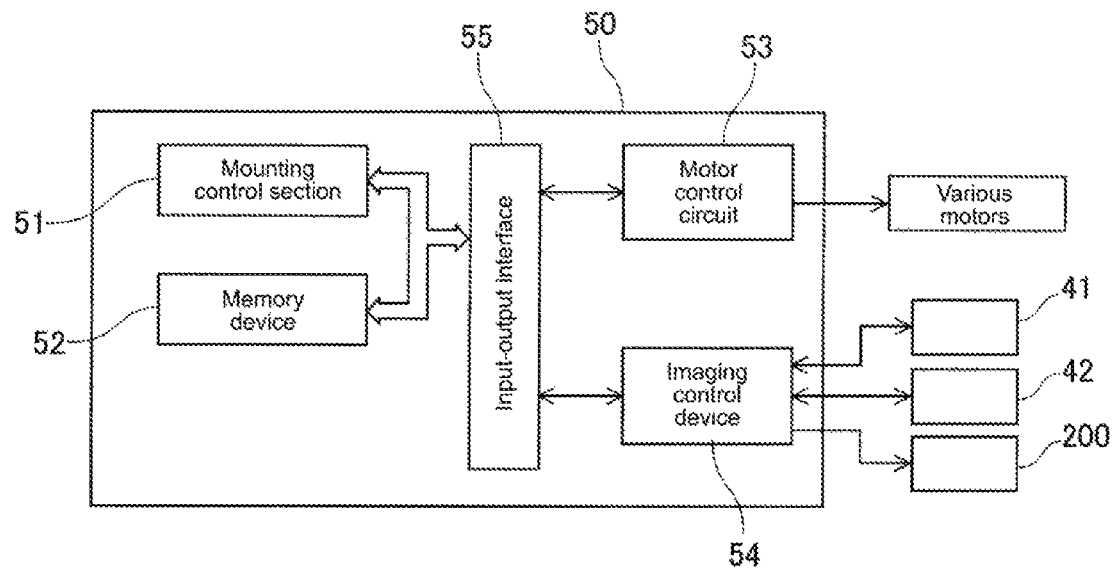
FIG. 2 is a block diagram of a control device.

As shown in FIG. 2, control device 50 mainly includes a CPU, various types of memory, and a control circuit. Control device 50 mainly includes mounting control section 51, memory device 52, motor control circuit 53, and imaging control device 54, and mounting control section 51 and memory device 52 are connected to motor control circuit 53 and imaging control device 54 via input-output interface 55.

Mounting control section 51 controls the position of mounting head 33 and operation of the pickup mechanism via motor control circuit 53. More specifically, mounting control section 51 receives information obtained from various sensors provided in substrate work machine 100 and the results of various recognition processing. Then, mounting control section 51 transmits control signals to motor control circuit 53 based on a control program stored in memory device 52, information from various sensors, and the results of image processing and recognition processing. Accordingly, the position and rotation angle of suction nozzle 35 attached to mounting head 33 is controlled.

Motor control circuit 53 controls various motors provided in component transfer device 30 based on control signals received from mounting control section 51. As a result, mounting head 33 is positioned, and the Z-axis position and rotational angles of suction nozzle 35 are determined.

Imaging control device 54 performs imaging using component camera 41 and board camera 42 based on control signals received from control device 50. Also, imaging control device 54 acquires image data from imaging by component camera 41 and board camera 42 and memorizes the image data on memory device 52 via input-output interface 55.

Based on the image data acquired by the imaging of component camera 41, control device 50 checks an error in the pickup attitude, a deviation in the rotational angle, and the like of the component held by suction nozzle 35. Then, control device 50 performs control for adjusting the pickup attitude of the component or control for discarding a component that is difficult to be mounted as required. Further, control device 50 recognizes the positioning marks affixed to circuit board K and recognizes the positioning state of circuit board K by performing image processing of the image data acquired by the imaging by board camera 42. Then, control device 50 corrects the position of moving body 32 according to the positioning state of circuit board K.

Information management device 200 manages traceability information of configuration items that constitute circuit board products. In the present embodiment, information management device 200 registers and manages the traceability information of circuit board K, which is a configuration item of a circuit board product, in a database. The circuit board K used in the circuit board product is assigned a serial number associated with traceability information, and an identification code in which the serial number is recorded is printed on the edge of the circuit board K. During the manufacturing process of the circuit board product, imaging control device 54 captures an image of the identification code printed on circuit board K using board camera 42, reads the serial number from the imaged identification code, and transmits the read serial number to information management device 200. Note that, the serial number is composed of multiple character strings.

2. Configuration of Imaging Control Device

Figures 3, 4:
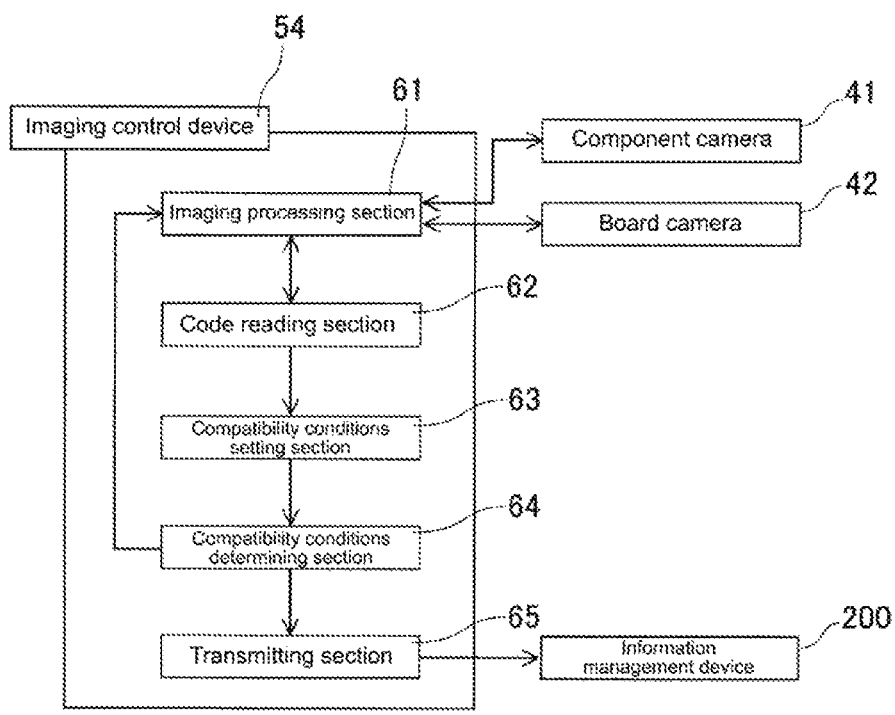
FIG. 3 is a block diagram of an imaging control device.
FIG. 4 shows an example of compatibility conditions set by the compatibility settings section.

Next, referring to FIG. 3, the configuration of imaging control device 54 is described. As shown in FIG. 3, imaging control device 54 includes imaging processing section 61, code reading section 62, compatibility conditions setting section 63, compatibility conditions determining section 64, and transmitting section 65.

Imaging processing section 61 performs imaging using component camera 41 and board camera 42 that have moved to the imaging position. Code reading section 62 reads the serial number recorded in the identification code imaged by board camera 42. Note that, in the present embodiment, the identification code printed on circuit board K is a two-dimensional code.

Compatibility conditions setting section 63 sets the compatibility conditions that should be met by the serial number read by code reading section 62. Here, in many cases, the same type of circuit board K is often assigned a similar serial number, and the serial number assigned to the same type of circuit board K includes many shared character strings. Thus, in the present embodiment, when continuously producing a circuit board product using the same type of configuration item, the operator sets a serial number type composed of character strings common to serial numbers assigned to the same type of circuit board K as the circuit board K used for the circuit board product to be produced, as the compatibility conditions to be set by compatibility conditions setting section 63.

Compatibility conditions determining section 64 determines whether the serial number read by code reading section 62 satisfies the compatibility conditions set by compatibility conditions setting section 63. When compatibility conditions determining section 64 determines that the read serial number satisfies the compatibility conditions set by compatibility conditions setting section 63, transmitting section 65 transmits the serial number to information management device 200.

Next, referring to the example of FIG. 4, the serial number type to be set by compatibility conditions setting section 63 will be described. For example, in example 1 of FIG. 4, the serial number type is for a case in which the operator supposes that all the serial numbers of the circuit boards K used for the circuit board products to be produced will start with "SN-".

In this case, the operator sets the serial number type "SN-*" as the compatibility conditions in compatibility conditions setting section 63. Note that, "*" is a character string of one or more characters. Thus, when the serial number read by code reading section 62 starts with "SN-", compatibility conditions determining section 64 determines that the compatibility conditions set in compatibility conditions setting section 63 are satisfied.

Further, the second example of FIG. 4, the serial number type is for a case in which the operator supposes that all the serial numbers of the circuit boards K used for the circuit board products to be produced start with "SN-", which is then followed by a 4-digit character string of numbers. In this case, the operator sets the serial number type "SN-\w\w\w\w" as the compatibility conditions in compatibility conditions setting section 63. Note that, "\w" is any one of the numerals "0 to 9". In this case, compatibility conditions determining section 64 determines that the compatibility conditions set in compatibility conditions setting section 63 are satisfied if the read serial number starts with "SN-" followed by a 4-digit character string of numbers.

Figure 5:
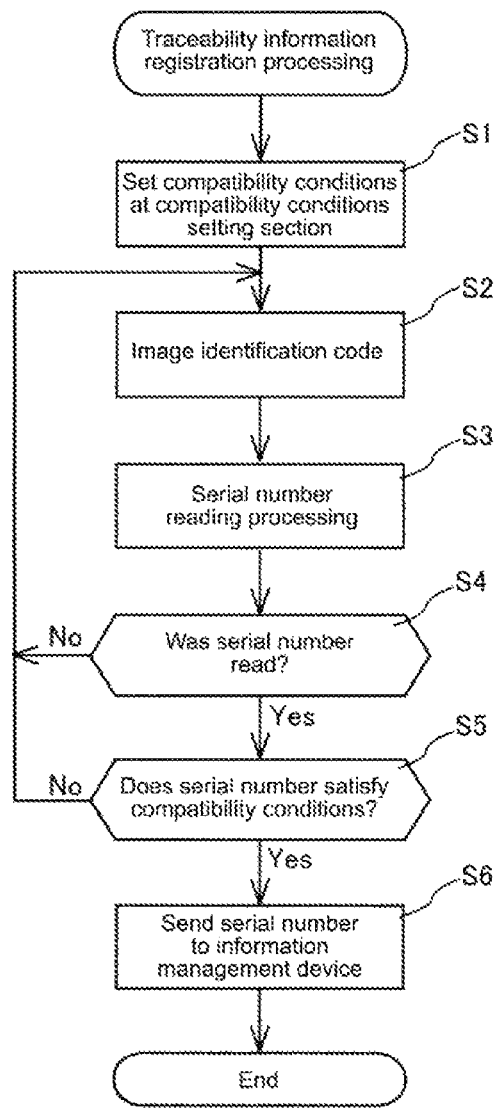
FIG. 5 is a flowchart showing traceability information registration processing performed by the imaging control device.

Next, referring to the flow chart shown in FIG. 5, traceability information registration processing executed by imaging control device 54 is described. As shown in FIG. 5, prior to starting production of the circuit board product, the operator predicts the serial number type based on the serial numbers assigned to each of the multiple circuit boards used for the circuit board products, and sets the predicted serial number type as compatibility conditions in compatibility conditions setting section 63 (S1).

Next, during the manufacturing process of the circuit board products, imaging processing section 61 captures an image of the identification code printed on the circuit board K positioned by board conveyance device 10 using board camera 42 (S2), and code reading section 62 performs reading processing of the serial number recorded in the imaged identification code (S3). If the serial number recorded in the identification code cannot be read by code reading section 62 (S4: no), imaging control device 54 returns to the processing of S2, and imaging processing section 61 executes imaging of the identification code printed on the circuit board K again.

On the other hand, if the serial number recorded in the identification code can be read by code reading section 62 (S4: yes), compatibility conditions determining section 64 determines whether the read serial number satisfies the compatibility conditions set in compatibility conditions setting section 63 (S5). As a result, when the compatibility conditions determining section 64 determines that the read serial number does not satisfy the compatibility conditions (S5: no), imaging control device 54 determines that there is an error in the process of reading the identification code by code reading section 62. Then, imaging control device 54 returns to the processing of S2, and performs image capturing of the identification code using the board camera again.

On the other hand, if the compatibility conditions determining section 64 determines that the read serial number satisfies the compatibility conditions (S5: yes), transmitting section 65 transmits the read serial number to information management device 200, and imaging control device 54 ends processing.

As described above, after reading the serial number recorded in the identification code, imaging control device 54 determines whether the read serial number satisfies the compatibility conditions. If it is determined that the serial number satisfies the compatibility conditions, imaging control device 54 transmits the serial number to information management device 200.

Thus, substrate work system 1 can prevent an erroneous serial number from being transmitted to information management device 200 when code reading section 62 erroneously reads the serial number recorded in the identification code by imaging an identification code to which dust, oil, or the like is adhered. As a result, substrate work system 1 can register reliable traceability information in information management device 200.

3. About Setting of Compatibility Conditions

In an embodiment described above, the serial number type predicted by the operator is set as the compatibility conditions in compatibility conditions setting section 63, but imaging control device 54 may generate the serial number type based on character strings shared by the serial numbers assigned to the same type of circuit boards K used for multiple circuit board products produced immediately before.

In this case, for example, imaging control device 54 stores the serial numbers of the first five circuit boards K used to produce the circuit board products in the memory device 52. Then, when the serial numbers of the first five circuit boards K used to produce the circuit board products have been stored, a character string shared by the five serial numbers are extracted and the serial number type is generated. As a result, the operator does not have to predict the serial number type to be set in compatibility conditions setting section 63, such that substrate work machine 100 can efficiently produce circuit board products.

In an embodiment above, a case in which the compatibility conditions to be set in compatibility conditions setting section 63 are the serial number type has been described, but the present disclosure is not limited thereto. For example, the compatibility conditions set in the compatibility conditions setting section 63 may be the number of characters of the read serial number. Further, when the identification code is a two-dimensional code, the compatibility conditions set in compatibility conditions setting section 63 may be the quantity of cells of the imaged two-dimensional code, the size of the two-dimensional code, the printing direction of the two-dimensional code, or the like. In this case, since the operator does not have to predict the serial number type to be set in compatibility conditions setting section 63, substrate work machine 100 can efficiently produce circuit board products.

4. Other

Board working machine 100 disclosed herein has been described based on the above embodiment, but the disclosure it is not limited to the above embodiment, and it may be easily inferred that various modifications and improvements can be made without departing from the spirit of the present disclosure. For example, in an embodiment above, a case where the identification code is a two-dimensional code has been described, but the configuration is not limited thereto, and the identification code may be a one-dimensional code (barcode).

Further, in an embodiment above, a case is described such that, when a serial number recorded in the identification code assigned to circuit board K among the configuration items used in the board manufacturing component is read, a determination as to whether the read serial number satisfies compatibility conditions is performed. However, the disclosure is not limited to this, and when reading a serial number recorded in the identification code attached to a configuration item other than the circuit board K, that is, a component mounted on the circuit board K with an identification code, it may be determined whether that read serial number satisfies the compatibility conditions.

REFERENCE SIGNS LIST

1: substrate work system;
42: board camera (imaging device);
54: imaging control device;
63: compatibility conditions setting section;
64: compatibility conditions determining section;
65: transmitting section;
200: information management device;
K: circuit board (examples of configuration items)

The invention claimed is:

1. A substrate work system comprising:
an information management device configured to manage traceability information of configuration items that configure a circuit board product;
an imaging device configured to image an identification code attached to the configuration item; and
an imaging control device configured to read the identification code imaged by the imaging device, and transmit a serial number recorded in the identification code to the information management device, wherein
the imaging control device includes
a compatibility conditions setting section configured to set compatibility conditions that the identification code attached to the configuration item should satisfy, the compatibility conditions including a character string that is shared by the serial numbers of the configuration items of a same type from the configuration items used in the circuit board product that is being produced,
a compatibility conditions determining section configured to determine whether the imaged identification code satisfies the compatibility conditions set by the compatibility conditions setting section, and
a transmitting section configured to, in a case in which it is determined that the identification code satisfies the compatibility conditions set by the compatibility conditions setting section, transmit the serial number to the information management device.

2. The substrate work system according to claim 1, wherein
the compatibility conditions setting section is configured to generate the serial number type based on a shared character string that is shared by the serial numbers of the configuration items of a same type used in multiple of the circuit board products that were produced immediately before.

3. A substrate work system according to claim 1, wherein the configuration item is a circuit board.

4. A substrate work system comprising:
an information management device configured to manage traceability information of configuration items that configure a circuit board product;
an imaging device configured to image an identification code attached to the configuration item; and
an imaging control device configured to read the identification code imaged by the imaging device, and transmit a serial number recorded in the identification code to the information management device, wherein
the imaging control device includes
a compatibility conditions setting section configured to set compatibility conditions that the serial number recorded in the identification code should satisfy, the compatibility conditions including a character string that is shared by the serial numbers of the configuration items of a same type from the configuration items used in the circuit board product that is being produced,
a compatibility conditions determining section configured to determine whether the serial number recorded on the imaged identification code satisfies the compatibility conditions set by the compatibility conditions setting section, and
a transmitting section configured to, in a case in which it is determined that the serial number recorded on the identification code satisfies the compatibility conditions set by the compatibility conditions setting section, transmit the serial number to the information management device.

5. A substrate work system comprising:
an information management device configured to manage traceability information of configuration items that configure a circuit board product;
an imaging device configured to image a two-dimensional identification code attached to the configuration item; and
an imaging control device configured to read the two-dimensional identification code imaged by the imaging device, and transmit a serial number recorded in the two-dimensional identification code to the information management device, wherein
the imaging control device includes
a compatibility conditions setting section configured to set compatibility conditions that the serial number recorded in the two-dimensional identification code should satisfy, the compatibility conditions including a cell quantity of the two-dimensional identification code shared by the configuration items of a same type used in the circuit board,
a compatibility conditions determining section configured to determine whether the serial number recorded on the imaged two-dimensional identification code satisfies the compatibility conditions set by the compatibility conditions setting section, and
a transmitting section configured to, in a case in which it is determined that the serial number recorded on the two-dimensional identification code satisfies the compatibility conditions set by the compatibility conditions setting section, transmit the serial number to the information management device.

* * * * *